(12) United States Patent
Humpoletz et al.

(10) Patent No.: US 8,144,198 B2
(45) Date of Patent: Mar. 27, 2012

(54) IMAGING SYSTEM

(75) Inventors: Charles James Peter Humpoletz, Braintree (GB); Martin Charles Willis, Rayleigh (GB)

(73) Assignee: Infrared Systems Group, LLC, Lawrenceville, GA (US)

( * ) Notice: Subject to any disclaimer, the term of this patent is extended or adjusted under 35 U.S.C. 154(b) by 1400 days.

(21) Appl. No.: 11/678,993

(22) Filed: Feb. 26, 2007

(65) Prior Publication Data

US 2007/0211157 A1 Sep. 13, 2007

(30) Foreign Application Priority Data

Mar. 7, 2006 (GB) .................................. 0604529.8

(51) Int. Cl.
*H04N 5/33* (2006.01)
*H04N 5/30* (2006.01)
(52) U.S. Cl. ........................................ 348/164; 348/162
(58) Field of Classification Search .................. 348/162, 348/164
See application file for complete search history.

(56) References Cited

U.S. PATENT DOCUMENTS 7,271,937 B2 * 9/2007 Schrey et al. ................. 358/474
7,928,395 B2 * 4/2011 Grimberg ...................... 250/349
2002/0125430 A1 9/2002 Wood
2003/0184827 A1 10/2003 Fleury et al.
2004/0232333 A1 11/2004 Guldevall
2006/0038208 A1 2/2006 Terzioglu et al.

FOREIGN PATENT DOCUMENTS

EP 0980182 A1 7/1999

OTHER PUBLICATIONS

Search Report GB0604529.8.

* cited by examiner

*Primary Examiner* — David Lazaro
(74) *Attorney, Agent, or Firm* — Rodgers & Rodgers

(57) ABSTRACT

An imaging system, particularly a thermal imager, has a detector operating in at least two sensitivity modes. The detector is read on a pixel-by-pixel basis in each of at least two modes and output therefrom is substantially simultaneously displayed so that a wide range of thermal sensitivities are simultaneously displayed. The detector is, preferably, read out at maximum and minimum sensitivity levels at least half the field rate and, advantageously, at the field rate of a display. In a preferred embodiment, color is added to the normally provided gray scale output from the detector ranging from black for the coolest object through white and yellow to red for the hottest object.

18 Claims, 2 Drawing Sheets

IMAGING SYSTEM

BACKGROUND OF THE INVENTION

1. Field of the Invention

This invention relates to an imaging system and particularly, although not exclusively, to a thermal imaging camera.

2. Description of the Related Art

Imaging systems are known where radiant energy which may be visible light, or infrared, or in the X-ray spectrum, for example, is converted into electrical signals. The term "electrical signals" used herein is meant in its broadest aspect to include electromagnetic and opto-electric signals. Such energy also includes thermal energy used for viewing scenes where extreme temperature differences are evident, for example in fire fighting, where thermal energy is converted by a detector into electrical signals for viewing by an operator. Although this invention is intended principally in thermal imaging situations, the invention is applicable to imaging systems where a compromise is found between dynamic range and low contrast sensitivity.

FIG. 1 shows in block schematic form the basic components of a thermal imaging camera. Referring to FIG. 1, a lens 1 directs thermal radiant energy to a detector 2. The detector 2 may be of any known type and normally currently comprises a two-dimensional planar bolometric array which converts changes in temperature to a change in resistance or polarisation. Bolometric detectors converting temperature to a change in resistance include detectors having a vanadium oxide layer made, for example, by Infraredvision Technology Corp., Type No. ITC-1000, or where the detector is amorphous silicon and such a detector is made by Ulis, under Type No. UL 01011. Detectors of the polarisation type are made, for example, by Raytheon Commercial Infrared, under Type No. 200D.

The detector comprises a plurality of pixels which are typically scanned pixel by pixel and line by line. The output from each pixel is electronically processed by processing electronic circuitry 3, and such circuitry is known from ISG Thermal Systems Limited Talisman Elite thermal imaging camera, Part No. K82MAD002CBAB, before being passed to a display 4, which is typically an LCD display, although it will be understood that the type of display utilised is application dependent. The display may be incorporated with the lens detector and processing electronics in a portable handheld unit or the display may be remote from the lens detector and processing electronics.

In operation, the thermal imaging camera detector 2 receives thermal radiation and the detector converts the thermal energy to electrical signals. The sensitivity of the detector is the relationship between the difference in thermal energy received by the detector and the magnitude of the difference in the resulting electrical signal output. It is known to adjust the sensitivity of the detector, either by adjusting a bias voltage applied to the detector between predetermined levels, or by adjusting the integration time by means of adjusting the duty cycle of a digital control signal.

The sensitivity of the detector arising from exposure to thermal radiation directly relates to the range of thermal energy that the detector can convert into electrical signals before the detector becomes saturated. Thus, if the detector is biased for high sensitivity, then it is able to convert the scenes with a low temperature difference into electrical signals with a difference sufficiently large enough to be processed effectively by the processing electronics 3. However, the higher the sensitivity, the lower the maximum temperature before the detector saturates. In other words, if the detector is biased for low sensitivity to avoid saturation, then only a scene with a larger temperature difference can be effectively converted into electrical signals to be processed. In a thermal imaging camera, this biasing arrangement is directly related to the sensitivity of the detector. The greater the sensitivity, the lower the scene contrast that can be effectively converted.

Alternatively, the sensitivity may be controlled via integration time as follows. The length of time that the detector accumulates electrical signals arising from exposure to thermal radiation, directly relates to the range of thermal energy that the detector can convert into electrical signals before the detector becomes saturated. Thus, if the detector accumulates for long periods, then it is able to convert the scenes with a low temperature difference into electrical signals with a difference sufficiently large enough to be processed effectively by the processing electronics 3. However, the longer the accumulation, the lower the maximum temperature before the detector saturates. In other words, if the detector accumulates for short periods of time to avoid saturation, then only a scene with a larger temperature difference can be effectively converted into electrical signals to be processed. In a thermal imaging camera, this accumulation period is called the integration time and is directly related to the sensitivity of the detector. The longer the integration time, the lower the scene contrast that can be effectively converted.

However, in such known systems, an operator is faced with using one or other sensitivity level. Thus, consider a fire fighter viewing a scene containing a high heat source, e.g. a fire. Ideally, the fire fighter needs to be able to recognise two pieces of information using their thermal imaging camera, namely:

detail around the fire that is cooler where a body or explosive substance may be located, and detail within the fire that is hot where information about the source and nature of the fire may be located.

So as to view the detail around the fire, the integration time, and hence the sensitivity of the detector, should be set at a maximum. This allows low contrast, low level information to be converted into electrical signals that may be viewed by a fire fighter. However, the fire in the scene will be saturated and detail within the fire will be lost. This situation is shown in the accompanying FIG. 2 which shows a high contrast scene with long integration and high sensitivity. The alternative is to reduce the integration time, thereby reducing the detector sensitivity, to provide good contrast within the fire. However, low contrast, cooler background detail is lost. Such a situation is shown in the accompanying FIG. 3 which shows the same scene as FIG. 2 with short integration, low sensitivity. In both FIGS. 2 and 3 the fire is represented by a very hot ceramic toroidal disc that is located on the right of the display in each FIG. 2, 3.

Current thermal imaging cameras switch between integration/sensitivity modes in order to view large thermal differences in a scene. Such switching is often performed automatically as a fire fighter pans a camera around a scene. However, when a hot part of the scene is viewed and the camera switches to low sensitivity mode, then details in the cooler parts of the scene may be lost, as indicated in FIG. 3. Thermal imaging cameras normally operate with a maximum integration period, i.e. high sensitivity which is termed herein, for convenience, the "non-EI" mode (NEI), and upon detection of thermal energy above a predefined threshold, so the integration time is switched to a minimum or minimum sensitivity mode which is termed herein, for convenience, the "EI" mode. As indicated above, such switching enables high level data to be viewed by altering the dynamic range of the detector. Such switching takes place over a period of several fields, typically five or six fields, during which time a scene is not updated. Clearly, such loss of information is detrimental.

For the sake of candour in providing prior art disclosure, the inventors are aware that instead of varying the integration time, it is also known to adjust the bias voltage applied to a detector to effect high or low sensitivity detection.

As will be seen from FIGS. 2 and 3, the disadvantage of the prior art is the loss of detail in low contrast areas of a viewed scene and the interruption of viewing caused by the switching of sensitivity levels.

Additional disadvantages include the potential to confuse a user by the necessity to display different transfer functions between scene temperature and display intensity at different times.

The present invention seeks to at least partially mitigate the foregoing disadvantages.

SUMMARY OF THE INVENTION

According to a first aspect of this invention there is provided an imaging system including detector means arranged to convert an image into electrical signals and processor means arranged to manipulate said signals for viewing on a display means, said detector means having plural pixels each with at least two sensitivity levels, said detector means being arranged to switch repetitively between the sensitivity levels, said processor means being arranged to select an appropriate sensitivity level from data collected for each pixel for display in dependence upon preset threshold criteria being met, said display means being arranged to display detected pixels that are processed with differing sensitivity levels at substantially the same time, and a color adder arranged to convert data images from the detector means which are in a gray scale to color images.

Preferably, the color adder is arranged to be provided with plural threshold signals which each define a color range.

Advantageously, the processor means is arranged to read out electrical signals from the detector means at a rate which is no slower than half the field rate of the display means and, preferably, at the field rate of the display means.

Conveniently, two sensitivity levels are provided which are a maximum and minimum sensitivity level. Alternatively, two sensitivity levels are used, and said levels are either predetermined or are adjusted interactively.

Advantageously, the detector means is arranged to be operated sequentially at maximum and minimum sensitivities and the resulting data is selected by said processor mans to display a minimum sensitivity when said threshold criteria are met.

In a currently preferred embodiment, said system is a thermal imaging camera and said detector means is a two-dimensional planar bolometric array.

Advantageously, said processor means includes integration and timing control means arranged to control the detector means sensitivity levels for each pixel and to switch sequentially between said levels, a plurality of store means arranged to store image data for present and previous images at respective sensitivities, combining means arranged to combine said stored image data into a combined data steam based on said threshold criteria being met, and output means arranged to output said combined data stream to said color adder.

Advantageously, maximum sensitivity is arranged to define a color scale from white to green and the minimum sensitivity is arranged to define a color scale from green to red.
imaging a scene including:

According to a second aspect of this invention there is provided a method of converting an image into electrical data signals by a detector means having plural pixels each pixel having at least two sensitivity levels, repetitively switching between said sensitivity levels, processing said electrical signals by processor means arranged to select appropriate data from a desired one of the sensitivity levels from each pixel in dependence upon preset threshold criteria of the data signals from the detector means being met, adding color to correct the detected pixel data from a gray scale to color images, and displaying the detected pixel data that are processed with differing sensitivity levels in color at substantially the same time.

Preferably, the color adder has inputs including plural threshold signals which each define a color range.

Advantageously, the electrical signals are read out from the detector means at a rate which is no slower than half the field rate of the display means and, preferably, at the field rate of the display means.

Conveniently, two sensitivity levels are provided which are maximum and minimum sensitivity levels.

Alternatively, where two sensitivity levels are used, said levels are either predetermined or are adjusted interactively by a user.

Advantageously, the detector means is operated sequentially at maximum and minimum sensitivities and the resulting data is selected by said processor means to display a minimum sensitivity when said threshold criteria are met.

In a currently preferred embodiment, said imaging system is a thermal imaging camera and said detector is a two-dimensional planar bolometric array.

Advantageously, said processor means selects data corresponding to differing sensitivity levels in dependence upon threshold criteria being met, stores image data for present and previous images at respective sensitivity levels, combines the stored image data into a combined data stream, and outputs the combined data stream to said color adder.

Advantageously, maximum sensitivity is arranged to define a color scale from white to green and the minimum sensitivity is arranged to define a color scale from green to red.

BRIEF DESCRIPTION OF THE DRAWINGS

The invention will now be described, by way of example, with reference to the accompanying drawings, in which.

In the Figures, like reference numerals denote like parts.

DESCRIPTION OF THE PREFERRED EMBODIMENTS

Figure 1:
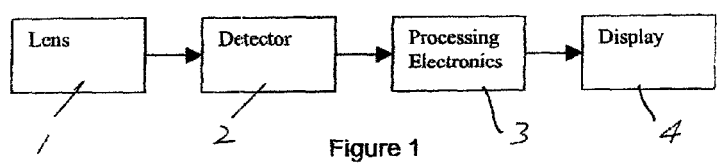
FIG. 1 shows in block schematic form a known thermal imaging camera.
Figure 2:
FIG. 2 shows a high contrast scene with a known thermal imaging camera set at high sensitivity.
Figure 3:
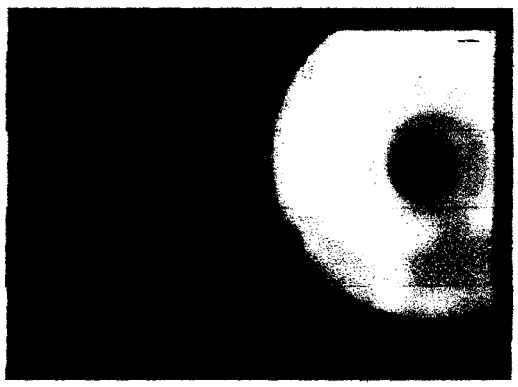
FIG. 3 shows the same scene as FIG. 2 with the thermal imaging camera set at low sensitivity.
Figure 4:
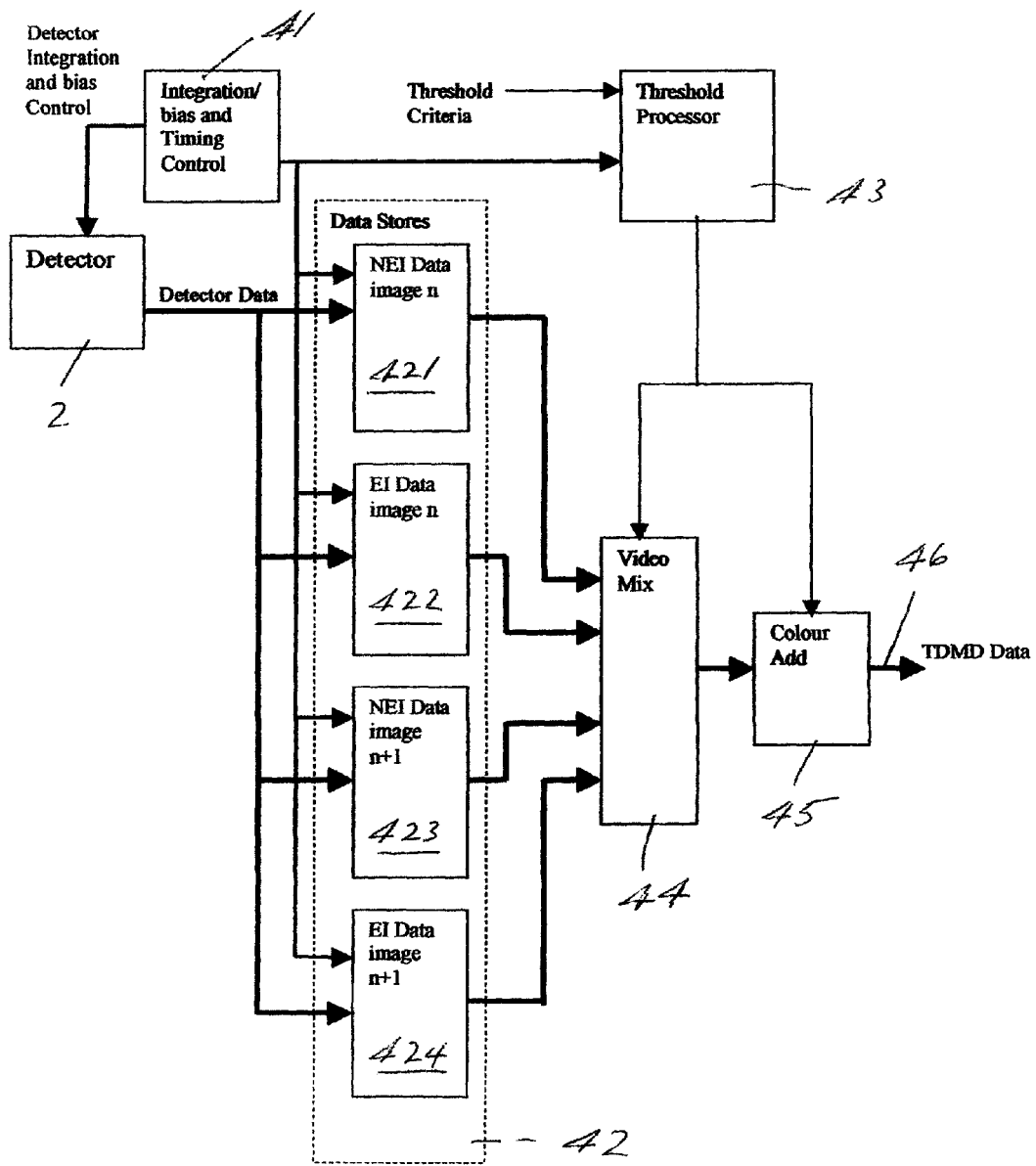
FIG. 4 shows in block schematic form a detector and processing electronic circuitry of an imaging system in accordance with this invention.

The imaging system shown in FIG. 4 has a detector 2 controlled by an integration or bias (sensitivity level) and timing control unit 41 and the detector provides output to a data storage block 42 which includes data stores 421-424. The unit 41 also controls a threshold processor 43 having a preset threshold criteria input which may be predetermined or system or operator manually adjustable threshold criteria.

The threshold criteria may be, for example, a system predetermined level or be based upon a temperature profile of part of a scene which exceeds a predetermined threshold value and the unit 41 also controls reading in of data to the data storage block 42 and the output of data from the data storage block is, preferably, clocked to a combiner 44 which effectively acts as a multiplexer for signals from each of the stores 421-444. The combiner 44 receives threshold signals from threshold processor 43 and provides output to a color adder 45 where gray scale images derived from the detector are converted to color images as described in greater detail hereinbelow. Output 46 from the color adder 45 is in the form of time division multimode display data for application to a display 4 (not shown in FIG. 4).

It will be appreciated by those skilled in the art that the detector pixel signals are read out at a faster rate than the rate at which the display 4 is updated. In this respect, the pixel elements are typically read out at a rate of 6 MHz (NTSC) or 6.85 MHz (PAL), whereas the display is updated at a field rate of either 60 Hz (NTSC) or 50 Hz (PAL).

In this invention the detector data from pixels is read out in different integration modes, i.e. with different sensitivities, and the results of the different integration modes are subjected to thresholding, combined and the most suitable data for a particular pixel is displayed so that, for example, pixels subject to different sensitivity modes are displayed substantially simultaneously to a user. Thus, for any one pixel, only one sensitivity mode is displayed at a time, although adjacent pixels can be at different sensitivities in one displayed image. The switching of integration times (sensitivities) is dependent upon the speed of readout of the detector which, assuming a fixed readout clock period, is dependent upon the number of pixels, i.e. resolution, of the detector. With lower resolution detectors, it is possible to read both integration (sensitivity) modes within the time of one field of the display 4, otherwise the readout occurs on alternate fields and is displayed so that the display is updated at half the field rate. The speed of the sensitivity switching is also governed by the ability of the detector to change sensitivity levels at that speed.

With the foregoing in mind, the unit 41 provides control over the detector and other units to which it is connected to provide switching between data taken from the pixel elements in EI or NEI modes. Data from the pixels is applied to the stores 421-424 to enable the data to be ready for processing.

The timing for storage of data is as given in the following table:

| Detector Integration | NEI | EI | NEI | EI | NEI | EI |
|---|---|---|---|---|---|---|
| Store Data | Image n | Image n | Image n + 1 | Image n + 1 | Image n + 2 | Image n + 2 |
| Read and Mix Data | Image n − 1 | Image n − 1 | Image n | Image n | Image n + 1 | Image n + 1 |

The data stores 421-424 hold signals output from the detector pixels in EI and NEI modes. By using stores to hold data for both integration modes, the stored data may be read from the store and processed while the detector data is being written to the store, providing non-interrupted video processing. The stores 421-424 may be clocked or may operate on a first-in first-out principle. The display is normally provided with data from the NEI mode and the threshold processor 43 constantly monitors the NEI data. Upon detection of the data meeting the threshold criteria 44, then the threshold processor applies a signal to the combiner 44 and color adder 45. It is, however, to be understood that the detector is constantly switched between the NEI and EI modes and the signals combined in the combiner 44. It is only when the threshold criteria are met that signals output from the combiner are applied with color for the EI mode, since, otherwise, when the EI mode is used below the threshold level, so colors applicable to the NEI mode are applied. The present invention has the advantage of being able to use only one color scale instead of a color scale for each sensitivity mode, thus making interpretation easier for a user.

Thus, the video mixer is effectively a multiplexer that switches between EI and NEI data controlled by the threshold processor 43.

Upon mixing, the video data, if left in the gray scale, would be confusing to a user's eye with hot objects being identified in both EI and NEI modes as either black or white—in dependence upon the video polarity being "black hot" or "white hot".

So as to make the video levels easier for the eye to determine which parts of the scene are hottest, the color adder 45 adds color to the scene so that for a white hot image generation:

in the NEI mode, the coolest object is seen as black going through white to the hottest object being viewed as green.

in the EI mode, the coolest object is seen as green (i.e. there is overlap with the hottest object in the NEI mode) going through yellow to red for the hottest object.

In greater detail, in order to enable video data to be displayed in a manner that identifies heat intensity of the scene, color is added by color adder 45.

Several, for example three, separate color ranges may be used to identify heat intensity, color ranges a, b and c. In this example, color range a is used to identify video data that has been acquired in high integration mode while color ranges b and c are used to identify video data that has been acquired in low integration (EI) mode.

An integration threshold signal is provided from threshold processor 43 to the color adder block 45 to indicate the video data that is presented to it as data that has been acquired in either high or low integration mode, on a pixel by pixel basis.

Additionally, color threshold signals (three in this example) are provided to the color adder block, to define the boundaries of each color range. These signals are provided by the threshold processor 43 as thresholds d, e and f.

The diagram below provides indication of the use of the threshold and color ranges.

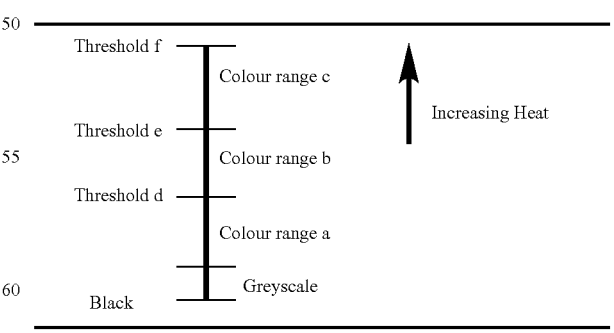

In the example, color range a represents data acquired in maximum integration (NEI) mode, while color ranges b and c represent data acquired in minimum integration (EI) mode. Threshold d value will correspond to the integration threshold signal input to the processor.

As an example, the video may be represented in the following way:
Color range a=white to green.
Color range b=green to yellow.
Color range c=yellow to red.
The threshold criteria values may be set to:
Threshold d=200° C.
Threshold e=500° C.
Threshold f=1000° C.

Within each color range, the video level may be represented by certain levels of luminance and chrominance. The encoding scheme may have a transfer function which maintains a smooth progression in both luminance and chrominance across each range. Alternatively, discontinuous changes in luminance, chrominance or both may be coded so as to identify particular video levels to the user.

Also within each color range, image enhancement techniques (for example, contrast stretching or histogram modifications) may be employed.

Using these colors as an example, then the video will be displayed as:
All scene data below 200° C. will be displayed in color from peak white to peak green.
All scene data between 200° C. and 500° C. will be displayed in color from peak green to peak yellow.
All scene data between 500° C. to 1000° C. will be displayed in color from peak yellow to peak red.

It will thus, be understood that with the present invention an imaging system extracts detector data at least two different sensitivity levels of the detector and the data corresponding to the different sensitivity levels are selected on a pixel-by-pixel basis and substantially simultaneously applied to a display so that objects which, in a thermal imager are coolest going through to the hottest, are simultaneously viewed on a display and in color, in distinction to prior art arrangements where each sensitivity mode is separately displayed in a gray scale.

Although the present invention has been described with reference to preferred embodiments, workers skilled in the art will recognize that changes may be made in form and detail without departing from the spirit and scope of the invention as defined in the appended claims.

We claim:

1. An imaging system including detector means arranged to convert an image into electrical signals and processor means arranged to manipulate said signals for viewing on a display means, said detector means having plural pixels each with at least two sensitivity levels, said detector means being arranged to switch repetitively between the sensitivity levels, said processor means being arranged to select an appropriate sensitivity level from data collected for each pixel for display in dependence upon preset threshold criteria being met, said display means being arranged to display detected pixels that are processed with differing sensitivity levels at substantially the same time, a color adder arranged to convert data images from the detector means which are in a gray scale to color images, said processor means including integration and timing control means arranged to control the detector means sensitivity levels for each pixel and to switch sequentially between said levels, a plurality of store means arranged to store image data for present and previous images at respective sensitivities, combining means arranged to combine said stored image data into a combined data stream based on said threshold criteria being met, and output means arranged to output said combined data stream to said color adder.

2. An imaging system as claimed in claim 1, wherein the color adder is arranged to be provided with plural threshold signals which each define a color range.

3. An imaging system as claimed in claim 1, wherein the processor means is arranged to read out electrical signals from the detector means at a rate which is no slower than half the field rate of the display means.

4. An imaging system as claimed in claim 1, wherein the processor means is arranged to read out electrical signals from the detector means at the field rate of the display means.

5. An imaging system as claimed in claim 1, wherein two sensitivity levels are provided which are a maximum and minimum sensitivity level.

6. An imaging system as claimed in claim 1, wherein two sensitivity levels are used, and said levels are one of predetermined and adjusted interactively.

7. An imaging system as claimed in claim 1, wherein the detector means is operated sequentially at maximum and minimum sensitivities and the resulting data are selected by said processor means to display a minimum sensitivity when said threshold criteria are met.

8. An imaging system as claimed in claim 1, wherein said system is a thermal imaging camera and said detector means is a two-dimensional planar bolometric array.

9. An imaging system as claimed in claim 7, wherein maximum sensitivity is arranged to define a color scale from white to green and the minimum sensitivity is arranged to define a color scale from green to red.

10. A method of imaging a scene including:
converting an image into electrical data signals by a detector means having plural pixels, each pixel having at least two sensitivity levels,
repetitively switching between said sensitivity levels,
processing said electrical signals by processor means arranged to select appropriate data from a desired one of the sensitivity levels from each pixel in dependence upon preset threshold criteria of the data signals from the detector means being met,
adding color to correct the detected pixel data a gray scale to color images,
displaying the detected pixel data that are processed with differing sensitivity levels in color at substantially the same time, and
said processor means selecting data corresponding to differing sensitivity levels in dependence upon threshold criteria being met,
storing image data for present and previous images at respective sensitivity levels,
combining the stored image data into a combined data stream, and
outputting the combined data stream to said color adder.

11. A method as claimed in claim 10, wherein the color adder has inputs including plural threshold signals which each define a color range.

12. A method as claimed in claim 10, wherein the electrical signals are read out from the detector means at a rate which is no slower than half the field rate of the display means.

13. A method as claimed in claim 10, wherein the electrical signals are read out from the detector means at a rate which is at the field rate of the display means.

14. A method as claimed in claim 11, wherein two sensitivity levels are provided which are maximum and minimum sensitivity levels.

15. A method as claimed in claim 11, wherein two sensitivity levels are used, said levels are one of predetermined and adjusted interactively by a user.

16. A method as claimed in claim 10, wherein the detector means is operated sequentially at maximum and minimum sensitivities and the resulting data are selected by said processor means to display a minimum sensitivity when said threshold criteria are met.

17. A method as claimed in claim 10, wherein said imaging system is a thermal imaging camera and said detector is a two-dimensional planar bolometric array.

18. A method as claimed in claim 16, wherein maximum sensitivity is arranged to define a color scale from white to green and the minimum sensitivity is arranged to define a color scale from green to red.

* * * * *